United States Patent
Hsu

(10) Patent No.: US 10,192,875 B2
(45) Date of Patent: Jan. 29, 2019

(54) NON-VOLATILE MEMORY WITH PROTECTIVE STRESS GATE

(71) Applicant: eMemory Technology Inc., Hsinchu (TW)

(72) Inventor: Te-Hsun Hsu, Hsinchu County (TW)

(73) Assignee: eMemory Technology Inc., Hsinchu (TW)

(*) Notice: Subject to any disclaimer, the term of this patent is extended or adjusted under 35 U.S.C. 154(b) by 26 days.

(21) Appl. No.: 15/297,162

(22) Filed: Oct. 19, 2016

(65) Prior Publication Data

US 2017/0040330 A1    Feb. 9, 2017

Related U.S. Application Data

(63) Continuation-in-part of application No. 14/842,857, filed on Sep. 2, 2015, now Pat. No. 9,508,447.

(Continued)

(51) Int. Cl.

| | |
|---|---|
| H01L 29/788 | (2006.01) |
| H01L 29/423 | (2006.01) |
| G11C 16/04 | (2006.01) |
| H01L 27/11524 | (2017.01) |
| H01L 27/11519 | (2017.01) |
| G11C 16/10 | (2006.01) |
| G11C 17/16 | (2006.01) |
| G11C 17/18 | (2006.01) |

(Continued)

(52) U.S. Cl.
CPC .... *H01L 27/11524* (2013.01); *G11C 16/0425* (2013.01); *G11C 16/0433* (2013.01); *G11C 16/10* (2013.01); *G11C 17/16* (2013.01); *G11C 17/18* (2013.01); *H01L 27/11206* (2013.01); *H01L 27/11519* (2013.01); *H01L 29/42328* (2013.01); *H01L 29/7881* (2013.01); *G11C 16/08* (2013.01)

(58) Field of Classification Search
CPC ................... G11C 16/0425; G11C 16/0433
See application file for complete search history.

(56) References Cited

U.S. PATENT DOCUMENTS

| | | | |
|---|---|---|---|
| 6,044,017 A | 3/2000 | Lee et al. | |
| 6,515,899 B1* | 2/2003 | Tu .................... | G11C 16/0433 365/185.05 |

(Continued)

*Primary Examiner* — Allen L Parker
*Assistant Examiner* — Gustavo G Ramallo
(74) *Attorney, Agent, or Firm* — JCIPRNET

(57) ABSTRACT

A non-volatile memory including following elements is provided. The floating gate transistor, the select transistor and the stress-releasing transistor are disposed on the substrate and coupled in series with each other. The stress-releasing transistor is located between the floating gate transistor and the select transistor. The stress-releasing transistor has a stress release ratio represented by formula (1). A lower limit value of the stress release ratio is determined by a sustainable drain side voltage of the stress-releasing transistor of the non-volatile memory which is unselected when a program operation is performed. An upper limit value of the stress release ratio is determined by a readable drain current of the non-volatile memory which is selected when a read operation is performed.

The stress release ratio=a channel length of the stress-releasing transistor/a gate dielectric layer thickness of the stress-releasing transistor      (1).

21 Claims, 3 Drawing Sheets

Related U.S. Application Data

(60) Provisional application No. 62/063,410, filed on Oct. 14, 2014.

(51) Int. Cl.
 *H01L 27/112* (2006.01)
 *G11C 16/08* (2006.01)

(56) References Cited

U.S. PATENT DOCUMENTS

| | | |
|---|---|---|
| 6,628,550 B1 | 9/2003 | Hung et al. |
| 7,326,994 B2 | 2/2008 | Hsu et al. |
| 9,502,426 B1 * | 11/2016 | Kuo ................ H01L 21/823462 |
| 2004/0130950 A1 | 7/2004 | Lee et al. |
| 2007/0097743 A1 | 5/2007 | Fang et al. |
| 2007/0243680 A1 | 10/2007 | Harari et al. |
| 2009/0159946 A1 | 6/2009 | Huang et al. |
| 2011/0182110 A1 * | 7/2011 | Yamazaki ............. G11C 11/404 |
| | | 365/149 |
| 2015/0187782 A1 * | 7/2015 | Yamakoshi ........ G11C 16/0441 |
| | | 257/321 |

* cited by examiner

NON-VOLATILE MEMORY WITH PROTECTIVE STRESS GATE

CROSS-REFERENCE TO RELATED APPLICATION

This application is a continuation-in-part application of and claims the priority benefit of U.S. application Ser. No. 14/842,857, filed on Sep. 2, 2015, now allowed, which claims the priority benefit of U.S. provisional application Ser. No. 62/063,410, filed on Oct. 14, 2014. The entirety of each of the above-mentioned patent applications is hereby incorporated by reference herein and made a part of this specification.

BACKGROUND OF THE INVENTION

Field of the Invention

The invention relates to a memory, and particularly relates to a non-volatile memory.

Description of Related Art

When semiconductor enters a deep sub-micron manufacturing process, a device size is gradually decreased, and in view of a memory device, it represents that a size of memory cell becomes smaller and smaller. On the other hand, along with increase of data required to be processed or stored by information electronic products, a memory capacity required in these information electronic products also becomes greater and greater. Regarding the situation that the device size becomes smaller and the memory capacity is required to be increased, to manufacture a memory device with a small size, a high integration degree and good quality becomes a target of effort in the industry.

Since a non-volatile memory device has an advantage that data stored therein is not disappeared after power-off, the non-volatile memory device has been widely used in personal computers and electronic equipment.

A conventional non-volatile memory is composed of a select transistor and a floating gate transistor. Since only one layer of polysilicon is required to be formed, the manufacturing process of such non-volatile memory can be integrated with a manufacturing process of a complementary metal oxide semiconductor transistor, so as to decrease the manufacturing cost.

However, in the conventional non-volatile memory, an input/output (I/O) device is generally adopted to serve as the select transistor, so that the non-volatile memory cannot be operated in a low power and high speed manner.

Moreover, if a core device is adopted to serve as the select transistor in order to achieve the lower power and high speed operation, during a program operation of the non-volatile memory, the select transistor bears an excessive stress, which may cause a problem of oxide breakdown.

SUMMARY OF THE INVENTION

The invention is directed to a non-volatile memory, which effectively decreases a stress on a select transistor.

The invention provides a non-volatile memory including a substrate, a floating gate transistor, a select transistor and a stress-releasing transistor. The floating gate transistor, the select transistor and the stress-releasing transistor are disposed on the substrate and coupled in series with each other. The stress-releasing transistor is located between the floating gate transistor and the select transistor. The stress-releasing transistor has a stress release ratio represented by formula (1).

$$\text{The stress release ratio} = \text{a channel length of the stress-releasing transistor}/\text{a gate dielectric layer thickness of the stress-releasing transistor} \qquad (1)$$

A lower limit value of the stress release ratio is determined by a sustainable drain side voltage of the stress-releasing transistor of the non-volatile memory which is unselected (also described as the unselected non-volatile memory) when a program operation is performed. An upper limit value of the stress release ratio is determined by a readable drain current of the non-volatile memory which is selected (also described as the selected non-volatile memory) when a read operation is performed.

According to an embodiment of the invention, in the non-volatile memory, the floating gate transistor, the select transistor and the stress-releasing transistor are, for example, coupled in series by sharing a doped region.

According to an embodiment of the invention, in the non-volatile memory, the stress release ratio is, for example, 15 to 35.

According to an embodiment of the invention, in the non-volatile memory, the floating gate transistor includes a floating gate, a first doped region, a second doped region and a first dielectric layer. The floating gate is disposed on the substrate. The first doped region and the second doped region are respectively disposed in the substrate at two sides of the floating gate. The first dielectric layer is disposed between the floating gate and the substrate. The select transistor includes a select gate, a third doped region, a fourth doped region and a second dielectric layer. The select gate is disposed on the substrate. The third doped region and the fourth doped region are respectively disposed in the substrate at two sides of the select gate. The second dielectric layer is disposed between the select gate and the substrate. The stress-releasing transistor includes a stress-releasing gate, the second doped region, the third doped region and a third dielectric layer. The stress-releasing gate is disposed on the substrate. The second doped region is located between the floating gate and the stress-releasing gate, and the third doped region is located between the select gate and the stress-releasing gate. The third dielectric layer is disposed between the stress-releasing gate and the substrate.

According to an embodiment of the invention, the non-volatile memory further includes a first contact and a second contact. The first contact is connected to the select gate to provide a first voltage to the select gate. The second contact is connected to the stress-releasing gate to provide a second voltage to the stress-releasing gate.

According to an embodiment of the invention, in the non-volatile memory, the first voltage and the second voltage can be the same or different.

According to an embodiment of the invention, in the non-volatile memory, a channel length under the stress-releasing gate is, for example, smaller than a minimum channel length of a design rule of an input/output (I/O) device.

According to an embodiment of the invention, in the non-volatile memory, a thickness of the first dielectric layer is, for example, greater than a thickness of the second dielectric layer.

According to an embodiment of the invention, in the non-volatile memory, a thickness of the third dielectric layer is, for example, greater than a thickness of the second dielectric layer.

According to an embodiment of the invention, in the non-volatile memory, the second doped region and the third doped region are, for example, floating doped regions.

According to an embodiment of the invention, in the non-volatile memory, the first doped region to the fourth doped region are, for example, of a same conductive type.

According to an embodiment of the invention, the non-volatile memory further includes at least one first well region disposed in the substrate. The first doped region to the fourth doped region are located in the first well region.

According to an embodiment of the invention, in the non-volatile memory, a conductive type of the first doped region to the fourth doped region is, for example, different from a conductive type of the first well region.

According to an embodiment of the invention, the non-volatile memory further includes a first capacitor and a second capacitor. The first capacitor, the second capacitor and the floating gate transistor are disposed in separation and are coupled to each other.

According to an embodiment of the invention, in the non-volatile memory, the first capacitor, the second capacitor and the floating gate transistor are, for example, coupled by sharing the floating gate.

According to an embodiment of the invention, in the non-volatile memory, the first capacitor includes the floating gate, at least one fifth doped region, and a fourth dielectric layer. The fifth doped region is disposed in the substrate at two sides of the floating gate. The fourth dielectric layer is disposed between the floating gate and the substrate. The second capacitor includes the floating gate, at least one sixth doped region, and a fifth dielectric layer. The sixth doped region is disposed in the substrate at the two sides of the floating gate. The fifth dielectric layer is disposed between the floating gate and the substrate.

According to an embodiment of the invention, in the non-volatile memory, a thickness of the fourth dielectric layer and a thickness of the fifth dielectric layer are, for example, respectively greater than a thickness of the second dielectric layer.

According to an embodiment of the invention, the non-volatile memory further includes a second well region and a third well region. The second well region is disposed in the substrate. The fifth doped region is located in the second well region. The third well region is disposed in the substrate. The sixth doped region is located in the third well region.

According to an embodiment of the invention, in the non-volatile memory, when two adjacent well regions of the first well region, the second well region and the third well region are of a first conductive type, the two adjacent well regions of the first conductive type of the first well region, the second well region and the third well region are, for example, disposed in separation.

According to an embodiment of the invention, the non-volatile memory further includes a fourth well region of a second conductive type between the two adjacent well regions of the first conductive type of the first well region, the second well region and the third well region, wherein the second conductive type is different from the first conductive type.

According to an embodiment of the invention, in the non-volatile memory, when two adjacent well regions of the first well region, the second well region and the third well region are of different conductive types, the two adjacent well regions of the different conductive types of the first well region, the second well region and the third well region are, for example, disposed in separation or connected to each other.

According to an embodiment of the invention, in the non-volatile memory, an area of the floating gate in the second capacitor is, for example, grater than an area of the floating gate in the floating gate transistor and an area of the floating gate in the first capacitor.

According to an embodiment of the invention, in the non-volatile memory, an area of the floating gate in the floating gate transistor is, for example, greater than an area of the floating gate in the first capacitor.

According to the above descriptions, in the non-volatile memory of the invention, since the stress-releasing transistor is located between the floating gate transistor and the select transistor, when the program operation is performed to the non-volatile memory, a stress on the select transistor is decreased. In this way, even if a core device is taken as the select transistor to achieve a low power and high speed operation, oxide breakdown of the select transistor is avoided. Moreover, by using the determined manner of the lower limit value and the upper limit value of the stress release ratio, the oxide breakdown of the select transistor of the unselected non-volatile memory can be avoided, and the selected non-volatile memory can prevent a circumstance that the read current is too low to read the data from happening.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
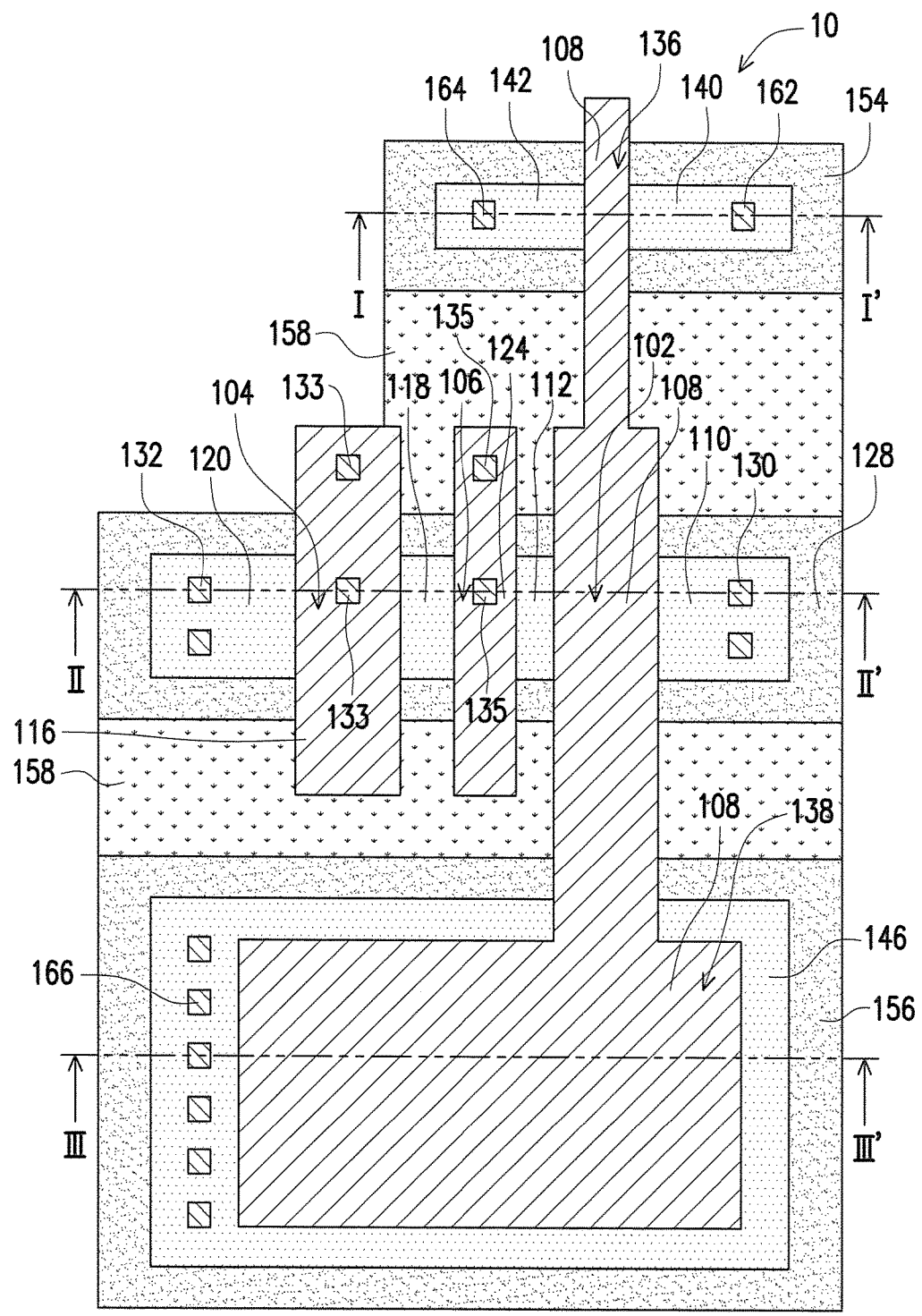
FIG. 1 is a top view of a non-volatile memory according to an embodiment of the invention.
Figure 2A:
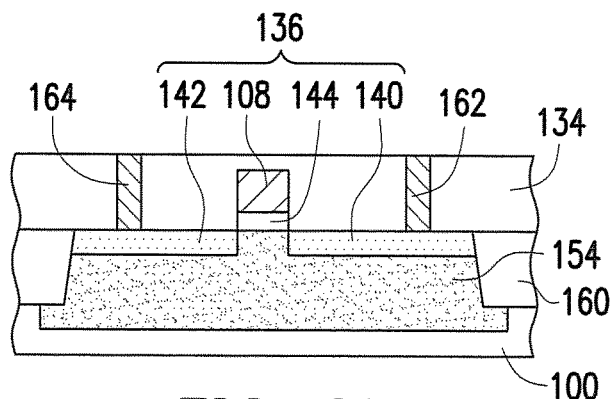
FIG. 2A is a cross-sectional view of FIG. 1 along a section line I-I'.
Figure 2B:
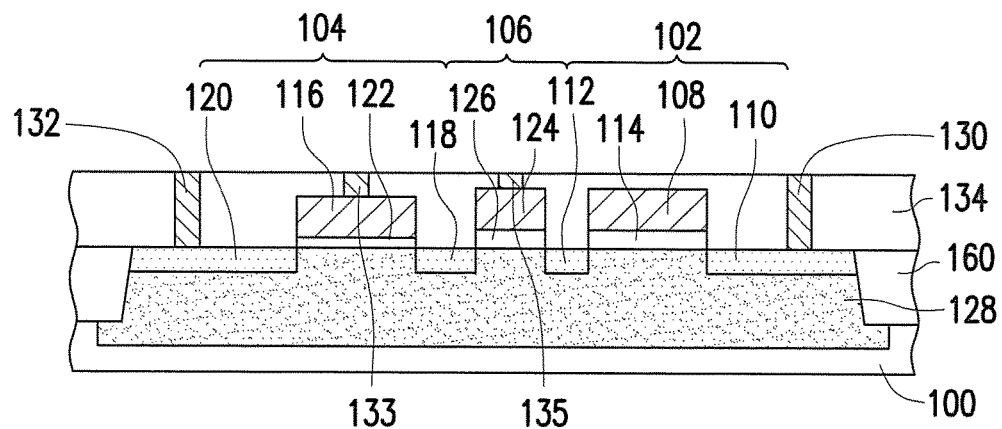
FIG. 2B is a cross-sectional view of FIG. 1 along a section line II-II'.
Figure 2C:
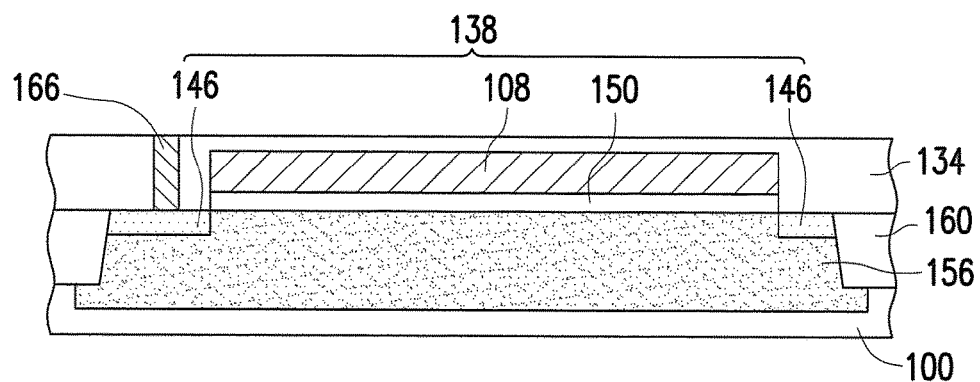
FIG. 2C is a cross-sectional view of FIG. 1 along a section line III-III'.

FIG. 1 is a top view of a non-volatile memory according to an embodiment of the invention. In FIG. 1, in order to clearly describe the structure of the non-volatile memory, an isolation structure and dielectric layers are omitted. FIG. 2A is a cross-sectional view of FIG. 1 along a section line I-I'. FIG. 2B is a cross-sectional view of FIG. 1 along a section line II-II'. FIG. 2C is a cross-sectional view of FIG. 1 along a section line III-III'.

Referring to FIG. 1 and FIG. 2B, the non-volatile memory 10 includes a substrate 100, a floating gate transistor 102, a select transistor 104 and a stress-releasing transistor 106. The floating gate transistor 102, the select transistor 104 and the stress-releasing transistor 106 are disposed on the substrate 100 and are coupled in series with each other. The stress-releasing transistor 106 is located between the floating gate transistor 102 and the select transistor 104, so that a stress on the select transistor 104 during the operation of the non-volatile memory 10 can be decreased through the stress-releasing transistor 106. The floating gate transistor 102, the select transistor 104 and the stress-releasing transistor 106 are, for example, coupled in series by sharing a doped region.

In this embodiment, the non-volatile memory 10 can be used as a memory cell of a memory array. The non-volatile memory 10 can be a selected memory cell or an unselected memory cell. When an operation is performed, the selected memory cell is a memory cell which is operated, and the unselected memory cell is a memory cell which is not operated. The operation is, for example, a program operation, an erase operation or a read operation.

The stress-releasing transistor 106 has a stress release ratio represented by formula (1). The stress release ratio is equal to a channel length of the stress-releasing transistor 106 divided by a gate dielectric layer thickness of the stress-releasing transistor 106.

$$\text{The stress release ratio} = \text{a channel length of the stress-releasing transistor}/\text{a gate dielectric layer thickness of the stress-releasing transistor} \quad (1)$$

A lower limit value of the stress release ratio is determined by a sustainable drain side voltage of the stress-releasing transistor 106 of the non-volatile memory 10 which is unselected when a program operation is performed. When the program operation is performed, a higher drain side voltage would be applied to the unselected non-volatile memory 10. Therefore, when the stress release ratio is smaller than the lower limit value, the stress-releasing transistor 106 cannot effectively reduce the higher stress caused by the higher drain side voltage. As a result, the select transistor 104 of the unselected non-volatile memory 10 will bear an excessive stress, so that the select gate leakage current will increase, and the select transistor 104 will be quickly damaged due to the oxide breakdown.

An upper limit value of the stress release ratio is determined by a readable drain current of the non-volatile memory 10 which is selected when a read operation is performed. When the stress release ratio is greater than the upper limit value, the drain current will be decreased and the drain current cannot be read effectively.

In an embodiment, the stress release ratio is, for example, 15 to 35. In another embodiment, the stress release ratio is, for example, 17 to 34.

Based on the above, by using the determined manner of the lower limit value and the upper limit value of the stress release ratio, the oxide breakdown of the select transistor 104 of the unselected non-volatile memory 10 can be avoided, and the selected non-volatile memory 10 can prevent a circumstance that the read current is too low to read the data from happening.

The floating gate transistor 102 includes a floating gate 108, a doped region 110, a doped region 112 and a dielectric layer 114. The floating gate 108 is disposed on the substrate 100. When a program operation is performed, electrons enter the floating gate 108 in the floating gate transistor 102 for storage. A material of the floating gate 108 is, for example, a conductive material such as doped polysilicon, etc., and a method for forming the floating gate 108 is, for example, a chemical vapor deposition method.

The doped region 110 and the doped region 112 are respectively disposed in the substrate 100 at two sides of the floating gate 108. The doped region 110 and the doped region 112 are, for example, of a same conductive type, which can be respectively an N-type doped region or a P-type doped region. A method for forming the doped region 110 and the doped region 112 is, for example, an ion implantation method.

The dielectric layer 114 is disposed between the floating gate 108 and the substrate 100. A material of the dielectric layer 114 is, for example, silicon oxide. A method for forming the dielectric layer 114 is, for example, a thermal oxidation method or the chemical vapor deposition method.

The select transistor 104 includes a select gate 116, a doped region 118, a doped region 120 and a dielectric layer 122. The select gate 116 is disposed on the substrate 100. A material of the select gate 116 is, for example, a conductive material such as doped polysilicon, etc., and a method for forming the select gate 116 is, for example, the chemical vapor deposition method.

The doped region 118 and the doped region 120 are respectively disposed in the substrate 100 at two sides of the select gate 116. The doped region 118 and the doped region 120 are, for example, of a same conductive type, which can be respectively the N-type doped region or the P-type doped region. When the non-volatile memory 10 is operated, the doped region 110 can be used as a drain electrode, and the doped region 120 can be used as a source electrode. A method for forming the doped region 118 and the doped region 120 is, for example, the ion implantation method. Moreover, the doped regions, 110, 112, 118 and 120 are, for example, of the same conductive type.

The dielectric layer 122 is disposed between the select gate 116 and the substrate 100. A thickness of the dielectric layer 114 is, for example, greater than a thickness of the dielectric layer 122. A material of the dielectric layer 122 is, for example, silicon oxide. A method for forming the dielectric layer 122 is, for example, the thermal oxidation method or the chemical vapor deposition method.

The stress-releasing transistor 106 includes a stress-releasing gate 124, the doped region 112, the doped region 118 and a dielectric layer 126, and the stress-releasing transistor 106 can be configured to release a part of stress transmitted to the select transistor 104, so as to decrease the stress on the select transistor 104. The stress-releasing gate 124 is disposed on the substrate 100. A channel length under the stress-releasing gate 124 is, for example, smaller than a minimum channel length of a design rule of an input/output (I/O) device, such that a short channel effect is occurred between the doped region 112 and the doped region 118, and a threshold voltage Vt of the stress-releasing transistor 106 can be smaller than a threshold voltage of the general I/O device. In an embodiment, the threshold voltage of the stress-releasing transistor 106 can be 0. A material of the stress-releasing gate 124 is, for example, a conductive material such as doped polysilicon, etc., and a method for forming the stress-releasing gate 124 is, for example, the chemical vapor deposition method.

The doped region 112 is located between the floating gate 108 and the stress-releasing gate 124, such that the stress-releasing transistor 106 and the floating gate transistor 102 can share the doped region 112. Moreover, the doped region 118 is located between the select gate 116 and the stress-releasing gate 124, such that the stress-releasing transistor 106 and the select transistor 104 can share the doped region 118. The doped region 112 and the doped region 118 are, for example, floating doped regions.

The dielectric layer 126 is disposed between the stress-releasing gate 124 and the substrate 100. The dielectric layer 126 can be used as a gate dielectric layer of the stress-releasing transistor 106. A thickness of the dielectric layer 126 is, for example, greater than the thickness of the dielectric layer 122. A material of the dielectric layer 126 is, for example, silicon oxide. A method for forming the dielectric layer 126 is, for example, the thermal oxidation method or the chemical vapor deposition method.

The non-volatile memory 10 may further include at least one well region 128 disposed in the substrate 100. The doped regions 110, 112, 118 and 120 are located in the well region 128. The well region 128 can be an N-type well region or a P-type well region. A method for forming the well region 128 is, for example, the ion implantation method. The conductive type of the doped regions 110, 112, 118 and 120 is, for example, different from the conductive type of the well region 128. In this embodiment, the non-volatile memory 10 is described as having one well region 128 as an example. Namely, the floating gate transistor 102, the select transistor 104, and the stress-releasing transistor 106 are located in the same well region 128. However, the invention is not limited thereto. In other embodiments, the well region of a core device and the well region of an input/output device may be manufactured separately. Thus, when the core device is adopted as the select transistor 104 and the input/output device is adopted as the floating gate transistor 102 and the stress-releasing transistor 106, the well region of the select transistor 104 and the well region of the floating gate transistor 102 and the stress releasing transistor 106 may also be different well regions.

The non-volatile memory 10 may further include a contact 130, a contact 132, a contact 133 and a contact 135. The contact 130 is connected to the doped region 110. The contact 130 can couple the doped region 110 to a bit line. The contact 132 is connected to the doped region 120. The contact 132 can couple the doped region 120 to a source line. The contact 133 is connected to the select gate 116 to provide a first voltage to the select gate 116. The contact 133 can couple the select gate 116 to a word line. The contact 135 is connected to the stress-releasing gate 124 to provide a second voltage to the stress-releasing gate 124. The contact 135 can couple the stress-releasing gate 124 to a stress-releasing line. The first voltage and the second voltage can be the same or different. When the first voltage and the second voltage are the same, the word line and the stress-releasing line can be coupled with each other or independently controlled. The contact 130, the contact 132, the contact 133 and a contact 135 can be disposed in the dielectric layer 134. A material of the contact 130, the contact 132, the contact 133 and a contact 135 is, for example, tungsten, copper or aluminium. A method for forming the contact 130, the contact 132, the contact 133 and a contact 135 is, for example, a physical vapor deposition method.

Referring to FIG. 1, FIG. 2A to FIG. 2C, the non-volatile memory 10 may further include a capacitor 136 and a capacitor 138. The capacitor 136, the capacitor 138 and the floating gate transistor 102 are disposed in separation and are coupled to each other. The capacitor 136, the capacitor 138 and the floating gate transistor 102 are, for example, coupled to each other by sharing the floating gate 108. An area of the floating gate 108 in the capacitor 138 is, for example, greater than an area of the floating gate 108 in the floating gate transistor 102 and an area of the floating gate 108 in the capacitor 136. The area of the floating gate 108 in the floating gate transistor 102 is, for example, greater than the area of the floating gate 108 in the capacitor 136.

In the present embodiment, a situation that the capacitor 136 and the capacitor 138 are located at two sides of the floating gate transistor 102 is taken as an example for description, though the invention is not limited thereto, and as long as the capacitor 136, the capacitor 138 and the floating gate transistor 102 are coupled to each other, it is considered to be within a protection scope of the invention. For example, a configuration method that the floating gate transistor 102 and the capacitor 136 are disposed at two sides of the capacitor 138 can also be adopted.

The capacitor 136 includes the floating gate 108, a doped region 140, a doped region 142 and a dielectric layer 144. The floating gate 108 in the capacitor 136 can serve as an erase gate. During an erase operation, electrons can move out from the floating gate 108 in the capacitor 136.

The doped region 140 and the doped region 142 are disposed in the substrate 100 at two sides of the floating gate 108. The doped region 140 and the doped region 142 can be of the same or different conductive types, which can be respectively the N-type doped region or the P-type doped region. A method for forming the doped region 140 and the doped region 142 is, for example, the ion implantation method.

The dielectric layer 144 is disposed between the floating gate 108 and the substrate 100. A thickness of the dielectric layer 144 is, for example, greater than a thickness of the dielectric layer 122. A material of the dielectric layer 144 is, for example, silicon oxide. A method for forming the dielectric layer 144 is, for example, the thermal oxidation method or the chemical vapor deposition method.

The capacitor 138 includes the floating gate 108, a doped region 146, and a dielectric layer 150. The floating gate 108 in the capacitor 138 can serve as a coupling gate. When the non-volatile memory is operated, the floating gate 108 in the capacitor 138 can be used to provide a correct voltage.

The doped region 146 is disposed in the substrate 100 at two sides of the floating gate 108. In this embodiment, the doped region 146 surrounds the floating gate 108 of the capacitor 138, so that the doped region 146 is located at two sides of the floating gate 108. The doped region 146 can be the N-type doped region, the P-type doped region or the N-type and P-type butted doped region.

The dielectric layer 150 is disposed between the floating gate 108 and the substrate 100. A thickness of the dielectric layer 150 is, for example, greater than the thickness of the dielectric layer 122. A material of the dielectric layer 150 is, for example, silicon oxide. A method for forming the dielectric layer 150 is, for example, the thermal oxidation method or the chemical vapor deposition method.

The non-volatile memory 10 may further include a well region 154 and a well region 156. The well region 154 is disposed in the substrate 100. The doped region 140 and the doped region 142 are located in the well region 154. The well region 156 is disposed in the substrate 100. The doped region 146 is located in the well region 156. The well region 154 and the well region 156 can be an N-type well region or a P-type well region. A method for forming the well region 154 and the well region 156 is, for example, the ion implantation method.

When two adjacent well regions of the well region 128, the well region 154 and the well region 156 are of the first conductive type, the two adjacent well regions of the first conductive type of the well region 128, the well region 154 and the well region 156 are, for example, disposed in separation. Moreover, the non-volatile memory 10 may further include a well region 158 of a second conductive type between the two adjacent well regions of the first conductive type of the well region 128, the well region 154 and the well region 156, wherein the second conductive type is different from the first conductive type. When the two adjacent well regions of the well region 128, the well region 154 and the well region 156 are of different conductive types, the two adjacent well regions of the different conductive types of the well region 128, the well region 154 and the well region 156 are, for example, disposed in separation or connected to each other. In the present embodiment, a situation that the well region 128, the well region 154 and the well region 156 are of the same conductive type is taken as an example for description.

The non-volatile memory 10 may further include an isolation structure 160. The isolation structure 160 can be disposed in the substrate 100 outside the well region 128, the well region 154 and the well region 156. The isolation structure 160 is, for example, a shallow trench isolation structure, and a material of the isolation structure 160 is, for example, silicon oxide.

The non-volatile memory 10 may further include a contact 162, a contact 164 and a contact 166. The contact 162 and the contact 164 are respectively connected to the doped region 140 and the doped region 142. The contact 162 and the contact 164 can respectively couple the doped region 140 and the doped region 142 to an erase line. The contact 166 is connected to the doped region 146. The contact 166 can couple the doped region 146 to a control line. The contact 162, the contact 164 and the contact 166 can be disposed in the dielectric layer 134. A material of the contact 162, the contact 164 and the contact 166 is, for example, tungsten, copper or aluminium. A method for forming the contact 162, the contact 164 and the contact 166 is, for example, the physical vapor deposition method.

In an embodiment, when the program operation, the read operation and the erase operation are performed, the voltages applied to the selected and unselected non-volatile memories 10 (the selected memory cell and the unselected memory cell) are exemplified in the following table 1, but the invention is not limited thereto. The floating gate transistor 102, the select transistor 104 and the stress-releasing transistor 106 in the non-volatile memories 10 are exemplified as the NMOS transistors.

TABLE 1

| memory cell | | WL | SRL | EL | CL | SL | BL | P-type sub-strate |
|---|---|---|---|---|---|---|---|---|
| program | selected | 0 V | 0 V | 10 V | 10 V | 0.6 V | 0 V | 0 V |
| operation | unselected | 0 V | 0 V | 10 V | 10 V | 0.6 V | 4 V | 0 V |
| read | selected | 0.6 V | 0.6 V | 0 V | 0 V | 0 V | 0.6 V | 0 V |
| operation | unselected | 0 V | 0 V | 0 V | 0 V | 0 V | 0.6 V | 0 V |
| erase | Selected | 0 V | 0 V | 10 V | 0 V | 0 V | 0 V | 0 V |
| operation | unselected | 0 V | 0 V | 0 V | 0 V | 0 V | 0 V | 0 V |

※ WL = word line;
SRL = Stress-releasing line;
EL = erase line;
CL = control line;
SL = source line;
BL = bit line FIG. 3 is a top view of a non-volatile memory according to another embodiment of the invention.

Figure 3:
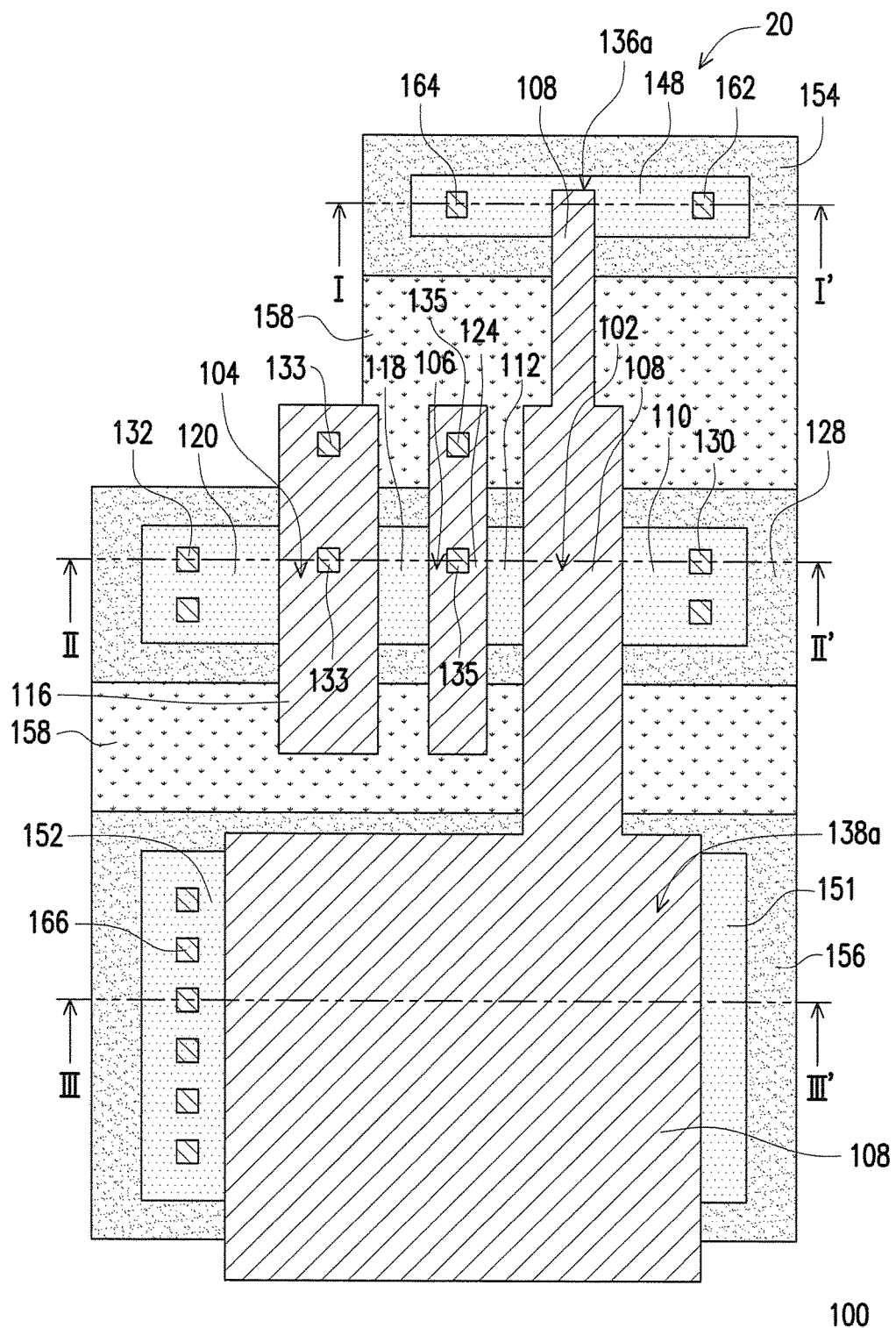
FIG. 3 is a top view of a non-volatile memory according to another embodiment of the invention.

Referring to FIGS. 1 and 3 together, a non-volatile memory 20 of FIG. 3 and the non-volatile memory 10 of FIG. 1 have differences as follows. The capacitor 136 of the non-volatile memory 10 includes two doped regions (140 and 142), while a capacitor 136a of the non-volatile memory 20 only includes one doped region 148 disposed in the substrate 100, and an end of the floating gate 108 of the capacitor 136a is located in the doped region 148. The doped region 148 surrounds the floating gate 108 of the capacitor 136a, so that the doped region 148 is located at two sides of the floating gate 108. In addition, the capacitor 138 of the non-volatile memory 10 includes one doped region 146, while a capacitor 138a of the non-volatile memory 20 includes doped regions 151 and 152. The doped regions 151 and 152 are disposed in the substrate 100 at two sides of the floating gate 108. Like components in the non-volatile memory 20 and the non-volatile memory 10 are represented by like symbols, and the descriptions thereof are thus not repeated in the following.

Based on the above embodiment, it can be known that people having ordinary skills in the art may adjust the number and configurations of the doped regions of the capacitors 136, 138, 136a, and 138a based on the design requirement of the product. For example, the design of the non-volatile memory 10 including the capacitor 136 with two doped regions (140, 142) may be modified into the design as in the non-volatile memory 20 that includes the capacitor 136a with only one doped region (148). Besides, the design of the non-volatile memory 20 including the capacitor 136a with one doped region (148) may be modified into the design as in the non-volatile memory 10 that includes the capacitor 136 with two doped regions (140, 142).

In summary, in the non-volatile memories 10 and 20 of the invention, since the stress-releasing transistor 106 is located between the floating gate transistor 102 and the select transistor 104, when the program operation is performed to the non-volatile memories 10 and 20, a stress on the select transistor 104 is decreased. In this way, even if a core device is taken as the select transistor 104 to achieve a low power and high speed operation, oxide breakdown of the select transistor 104 is avoided. Moreover, by using the determined manner of the lower limit value and the upper limit value of the stress release ratio, the oxide breakdown of the select transistors 104 of the unselected non-volatile memories 10 and 20 can be avoided, and the selected non-volatile memories 10 and 20 can prevent a circumstance that the read current is too low to read the data from happening.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile memory, comprising:
a substrate;
a floating gate transistor, a select transistor and a stress-releasing transistor, disposed on the substrate and coupled in series with each other, wherein the stress-releasing transistor is located between the floating gate transistor and the select transistor, and
the stress-releasing transistor has a stress release ratio represented by formula (1):

the stress release ratio=a channel length of the stress-releasing transistor/a gate dielectric layer thickness of the stress-releasing transistor    (1)

wherein a lower limit value of the stress release ratio is determined by a sustainable drain side voltage of the stress-releasing transistor of the non-volatile memory which is unselected when a program operation is performed, an upper limit value of the stress release ratio is determined by a readable drain current of the non-volatile memory which is selected when a read operation is performed, and the channel length under a stress-releasing gate of the stress-releasing transistor is smaller than a minimum channel length of a design rule of an input/output device; and a first capacitor and a second capacitor, wherein the first capacitor, the second capacitor and the floating gate transistor are disposed in separation and are coupled to each other.

2. The non-volatile memory as claimed in claim 1, wherein the floating gate transistor, the select transistor and the stress-releasing transistor are coupled in series by sharing a doped region.

3. The non-volatile memory as claimed in claim 1, wherein the stress release ratio is 15 to 35.

4. The non-volatile memory as claimed in claim 1, wherein the floating gate transistor comprises:
a floating gate, disposed on the substrate;
a first doped region and a second doped region, respectively disposed in the substrate at two sides of the floating gate; and
a first dielectric layer, disposed between the floating gate and the substrate;

the select transistor comprises:
a select gate, disposed on the substrate;
a third doped region and a fourth doped region, respectively disposed in the substrate at two sides of the select gate; and
a second dielectric layer, disposed between the select gate and the substrate;

the stress-releasing transistor comprises:
the stress-releasing gate, disposed on the substrate;
the second doped region and the third doped region, wherein the second doped region is located between the floating gate and the stress-releasing gate, and the third doped region is located between the select gate and the stress-releasing gate; and
a third dielectric layer, disposed between the stress-releasing gate and the substrate.

5. The non-volatile memory as claimed in claim 4, further comprising:
a first contact, connected to the select gate to provide a first voltage to the select gate; and
a second contact, connected to the stress-releasing gate to provide a second voltage to the stress-releasing gate.

6. The non-volatile memory as claimed in claim 5, wherein the first voltage and the second voltage are the same or different.

7. The non-volatile memory as claimed in claim 4, wherein a thickness of the first dielectric layer is greater than a thickness of the second dielectric layer.

8. The non-volatile memory as claimed in claim 4, wherein a thickness of the third dielectric layer is greater than a thickness of the second dielectric layer.

9. The non-volatile memory as claimed in claim 4, wherein the second doped region and the third doped region are floating doped regions.

10. The non-volatile memory as claimed in claim 4, wherein the first doped region to the fourth doped region are of a same conductive type.

11. The non-volatile memory as claimed in claim 4, further comprising:

at least one first well region, disposed in the substrate, wherein the first doped region to the fourth doped region are located in the at least one first well region.

12. The non-volatile memory as claimed in claim 11, wherein a conductive type of the first doped region to the fourth doped region is different from a conductive type of the at least one first well region.

13. The non-volatile memory as claimed in claim 11, wherein the first capacitor, the second capacitor and the floating gate transistor are coupled by sharing the floating gate.

14. The non-volatile memory as claimed in claim 11, wherein the first capacitor comprises:
the floating gate;
at least one fifth doped region, disposed in the substrate at two sides of the floating gate; and
a fourth dielectric layer, disposed between the floating gate and the substrate, the second capacitor comprises:
the floating gate;
at least one sixth doped region, disposed in the substrate at the two sides of the floating gate; and
a fifth dielectric layer, disposed between the floating gate and the substrate.

15. The non-volatile memory as claimed in claim 14, wherein a thickness of the fourth dielectric layer and a thickness of the fifth dielectric layer are respectively greater than a thickness of the second dielectric layer.

16. The non-volatile memory as claimed in claim 14, further comprising:
a second well region, disposed in the substrate, wherein the at least one fifth doped region is located in the second well region; and
a third well region, disposed in the substrate, wherein the at least one sixth doped region is located in the third well region.

17. The non-volatile memory as claimed in claim 16, wherein when two adjacent well regions of the at least one first well region, the second well region and the third well region are of a first conductive type, the two adjacent well regions of the first conductive type of the at least one first well region, the second well region and the third well region are disposed in separation.

18. The non-volatile memory as claimed in claim 17, further comprising:
a fourth well region of a second conductive type between the two adjacent well regions of the first conductive type of the at least one first well region, the second well region and the third well region, wherein the second conductive type is different from the first conductive type.

19. The non-volatile memory as claimed in claim 16, wherein when two adjacent well regions of the at least one first well region, the second well region and the third well region are of different conductive types, the two adjacent well regions of the different conductive types of the at least one first well region, the second well region and the third well region are disposed in separation or connected to each other.

20. The non-volatile memory as claimed in claim 14, wherein an area of the floating gate in the second capacitor is greater than an area of the floating gate in the floating gate transistor and an area of the floating gate in the first capacitor.

21. The non-volatile memory as claimed in claim 14, wherein an area of the floating gate in the floating gate transistor is greater than an area of the floating gate in the first capacitor.

* * * * *